United States Patent [19]
Nakashima

[11] Patent Number: 5,297,104
[45] Date of Patent: Mar. 22, 1994

[54] WORD LINE DRIVE CIRCUIT OF SEMICONDUCTOR MEMORY DEVICE

[75] Inventor: Takashi Nakashima, Seoul, Rep. of Korea

[73] Assignee: SamSung Electronics Co., Ltd., Kyungki, Rep. of Korea

[21] Appl. No.: 850,840

[22] Filed: Mar. 13, 1992

[30] Foreign Application Priority Data

Mar. 14, 1991 [KR] Rep. of Korea ................. 1991/4068

[51] Int. Cl.[5] ............................................... G11C 7/00
[52] U.S. Cl. ........................... 365/230.06; 365/189.11; 365/204
[58] Field of Search ...................... 365/230.06, 189.11, 365/189.09, 149, 203, 204

[56] References Cited

U.S. PATENT DOCUMENTS 4,678,941 7/1987 Chao et al. ................. 365/230.06 X
4,896,297 1/1990 Miyatake et al. .......... 365/230.06 X Primary Examiner—Joseph A. Popek
Attorney, Agent, or Firm—Robert E. Bushnell

[57] ABSTRACT

Disclosed is a word line drive circuit of an LSI semiconductor memory device comprising a plurality of word lines, a plurality of memory cells connected each to the word line, a row decoder and drive circuit connected to said plurality of word lines for selecting and driving the word line from a first voltage level to a second voltage level in response to an input address signal in a memory cycle, and a negative voltage generating circuit connected to the plurality of word lines for generating a negative voltage in a non-memory cycle, wherein the word line drive circuit comprises a reset circuit for maintaining the selected word line at an intermediate voltage level between the first voltage level and the second voltage level at least in one point of an end point and an starting point of the memory cycle.

24 Claims, 6 Drawing Sheets 5,297,104

WORD LINE DRIVE CIRCUIT OF SEMICONDUCTOR MEMORY DEVICE

FIELD OF THE INVENTION

This invention relates to a word line drive circuit for accessing an information stored in a cell connected between a word line and a bit line by the bit line in a semiconductor memory device, and more particularly to a word line drive circuit of a dynamic random access memory (DRAM).

TECHNICAL BACKGROUND OF THE INVENTION

Generally a DRAM comprises a memory cell having an access transistor and a storage capacitor, wherein the word line and the capacitor are connected with a gate and a source of the transistor respectively, and a drain of the transistor is connected to the bit line. Information is stored in the memory cell by charging a voltage of the bit line to the capacitor by turning on the transistor. After an active cycle (read or write cycle), a word line voltage is reset to a ground voltage so as to turn off the access transistor and accordingly the charged voltage of the storage capacitor is maintained in a stand-by state.

In case of a density of memory of a DRAM being increased, width and length of a channel of the transistor are required to be reduced so as to minimize an area occupied by the transistors. Such a scale-down of design rule requires a design rule of sub-micron in manufacturing a DRAM of tens of mega-RAMs. Accordingly a using voltage should be lowered to an extent of a source voltage of about 3 volts in order to solve a problem of break down voltage of a drain of the transistor. Such a low voltage as well as a short channel of the transistor create a sub-threshold phenomenon, namely a current can flow through a drain-source of the transistor even if a gate-source voltage is lower than a threshold voltage. Therefore, there is occurred a problem that a voltage charged in the capacitor of the memory cell is discharged through the drain-source path of the access transistor even if the access transistor is turned off in the stand-by state and a refresh operation should be performed within a quicker time. A prior art for solving the above mentioned problems is disclosed in the U.S. Pat. No. 4,610,003.

With reference to FIG. 1 illustrating the prior art, a word line drive circuit comprises a storage capacitor 22, a memory cell 20 having an access transistor 24 of which a source and a drain are connected between the capacitor and a bit line 26, a word line 28 connected to a gate of the transistor 24, a drive circuit 10 for driving the word line 28 by a given voltage through a switching transistor 14 in a read, write or refresh operation, a control circuit 12 for turning on the switching transistor 14 in response to an output of the drive circuit 10 in driving the word line, an oscillator 34 for generating a pulse of square wave having a given width of pulse, a charge pump circuit 30 for charging a capacitor 32 by generating a negative voltage in response to a pulse of the oscillator, and a transistor 18 of which a drain-source path is connected between an output end of the charge pump circuit 30 and the word line 28 and a gate is connected to an output of an inverter 16 for inverting an output of the control circuit 12. All transistors illustrated in FIG. 1 are the N channel MOS IG FET's, and a source supply voltage Vc is 5 volts.

FIG. 2 shows a voltage supplied from the word line 28 to the transistor 24 of the memory cell 20 as illustrated in FIG. 1. When the drive circuit 10 is activated by an address signal designating the memory cell 20, the drive circuit is converted from a ground voltage state to a source voltage Vc. By the source voltage Vc, the control circuit 12 is activated and generates a voltage of more than Vc+Vth so as to turn on the switching transistor 14. By the voltage of more than Vc+Vth, an output voltage Vc of the drive circuit 10 is supplied to the word line 28, which turns on the access transistor 24 by being charged with a source voltage Vc. On one hand, the transistor 18 is turned off by an output of the control circuit 12 and the inverter 16. The storage capacitor 22 is connected to the bit line through the transistor 24 and an information voltage stored in the capacitor 22 is discharged into the bit line 26. In other words, the bit line 26 is charged with the information voltage. When the drive circuit 10 is turned off, a ground voltage is transmitted. Accordingly the control circuit 12 generates a ground voltage state, the switching transistor 14 is turned off and the transistor 18 is turned on. Consequently a negative voltage of −3 volts charged in the capacitor 32 is transmitted to the word line 28 through the transistor 18. As a result the access transistor 24 is blocked deeply so as to prevent a sub-threshold current. When the storage capacitor 22 is charged with the source voltage Vc of 5 volts and the word line 28 is charged with the negative voltage, the charged voltage of the storage capacitor 22 is prevented from leaking because a gate-source voltage of the access transistor 24 is much lower than its threshold voltage.

In a conventional art, however, there is occurred a problem that the charge pump circuit is loaded greatly because the word line voltage is increased suddenly from a non-selection voltage of −3 volts to a selection voltage of 5 volts in selecting a word line and reduced suddenly from a boosted voltage of 5 volts to a negative voltage of −3 volts in a read/write operation (memory cycle). Furthermore, such a sudden voltage change of the word line may cause a damage on a memory device by breaking a thin oxide insulated film of a gate of transistors connected with word lines.

Such a sudden voltage change may be transferred to an adjacent line through a parasitic capacitance such that a false operation of a memory device may be brought about. Also in an LSI DRAM, a bump phenomenon of a source voltage of an oscillator is occurred due to a sudden increase of load of a charge pump circuit such that an false operation of a memory device is caused.

SUMMARY OF THE INVENTION

An object of this invention is to provide a word line drive circuit for reducing a load of a charge pump circuit in an LSI semiconductor memory device.

Another object of this invention is to provide a word line drive circuit for preventing a false operation of an LSI semiconductor memory device.

Still another object of this invention is to provide a word line drive circuit of good reliability in an LSI semiconductor memory device.

In order to achieve the objects of this invention, the word line is driven at least in one point of a start point and an end point of the memory cycle by an intermediate voltage level between a first and second voltage level in a word line drive method of a semiconductor memory device for maintaining the word line at the first voltage level in a non-memory cycle and at the second voltage level in a memory cycle respectively.

According to an aspect of the present invention, an LSI semiconductor memory device comprises a plurality of word lines, a plurality of memory cells each connected to each of the word lines, a row decoder and drive circuit connected to the word lines for selecting a word line in response to an input address signal and driving it from the first voltage level to the second voltage level in the memory cycle and a negative voltage generator connected to the word lines for generating a negative voltage in the non-memory cycle, wherein a reset circuit maintains the selected word line at the intermediate voltage level between the first and second voltage level at least in one point of the start point and then end point of the memory cycle.

And it is desirable that an absolute value of the difference of the second voltage level and the intermediate voltage level is larger than that of the first voltage level and the intermediate voltage level.

The present invention will now be described more specifically with reference to the drawings attached only by way of example.

DETAILED DESCRIPTION OF CERTAIN PREFERRED EMBODIMENTS

Figure 3:
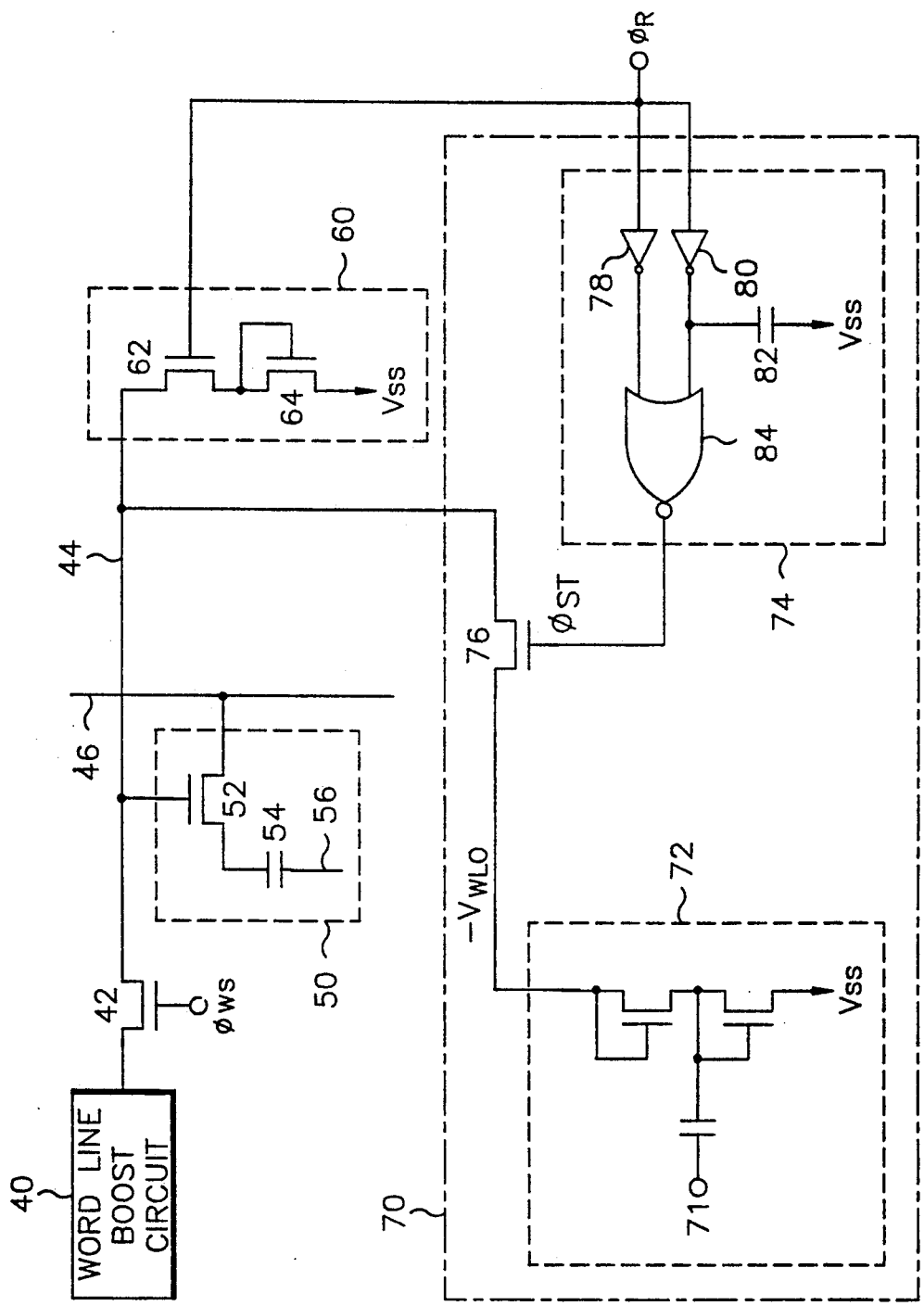
FIG. 3 is a view of an embodiment of a word line drive circuit of this invention.

With reference to FIG. 3, a memory cell comprising an access transistor 52 and a storage capacitor 54 is connected to an intersection of a word line 44 and a bit line 46. One electrode 56 of the storage capacitor 54 can be connected to a grounded voltage Vss, a source voltage Vcc or a given voltage. One memory cell 50 is illustrated in FIG. 3 for convenience, and practically a plurality of memory cells each is connected to a plurality of intersections of word lines and bit lines. One end of the word line 44 is connected to a word line boost circuit 40 through a first switching transistor 42, and a gate of the first switching transistor 42 is connected to a word line selection signal $\phi$ws supplied from a row decoder (not shown) for selecting the word line 44. The word line boost circuit 40, the first switching transistor 42 and the row decoder configure a row decoder and drive circuit, which charges the word line 44 with a boost voltage of the word line boost circuit 40 through the first switching transistor 42 turned on by the signal $\phi$ws of the row decoder. The row decoder and drive means is disclosed in page 493, No. 5, SC-16, of the IEEE Journal of Solid-state Circuits published in October 1981 and the U.S. Pat. Nos. 4,649,523 and 4,704,706. There is disclosed that an information voltage (source voltage Vcc) stored in the storage capacitor can be discharged to the bit line 46 and a write information voltage (source voltage Vcc) can be discharged to the storage capacitor 54 without dropping the threshold voltage of the access transistor 52 by way of charging the word line 44 by the boost voltage of the decoder and drive means.

The other end of the word line 44 is connected to a reset circuit 60 for discharging the charged voltage of the word line so as to be at the first voltage level. The reset circuit 60 comprises a reset transistor 62 and a transistor 64 having drain-source paths serially connected with each other between the word line 44 and the ground reference Vss. A gate of the reset transistor 62 is connected to the reset clock $\phi$R generated at an end of the memory cycle, and the transistor 64 is a diode connection transistor having a gate and drain connected in common. Therefore the reset circuit 60 discharges the voltage of the word line 44 so as to let the word line be at the threshold voltage level of the diode connection transistor 64 in response to the reset clock $\phi$R.

A negative voltage supply circuit 70 is connected to the word line 44 and discharges the boost voltage level (second voltage level) of the word line 44 so as to be at a negative first voltage level $-$Vwlo less than the second voltage level in response to the reset clock $\phi$R.

The negative voltage supply circuit 70 comprises a charge pump circuit 72 for generating a negative voltage $-$Vwlo in response to a pulse signal of an input terminal 71 from a pulse generating circuit of a given frequency, a delay circuit 74 for generating a control clock $\phi$st by delaying the reset clock $\phi$R timely and a second switching transistor 76 for connecting the voltage $-$Vwlo of the charge pump 72 to the word line 44 in response to the control clock $\phi$st. The delay circuit 74 comprises a first and a second inverters 78, 80 for inverting the reset clock $\phi$R, a NOR gate 84 of which a first and a second input terminals are connected to the first and second inverters 78, 80 respectively and a capacitor 82 connected between the second input terminal and the ground voltage Vss. The transistors illustrated in FIG. 3 are all the N channel MOS transistors.

Figure 1:
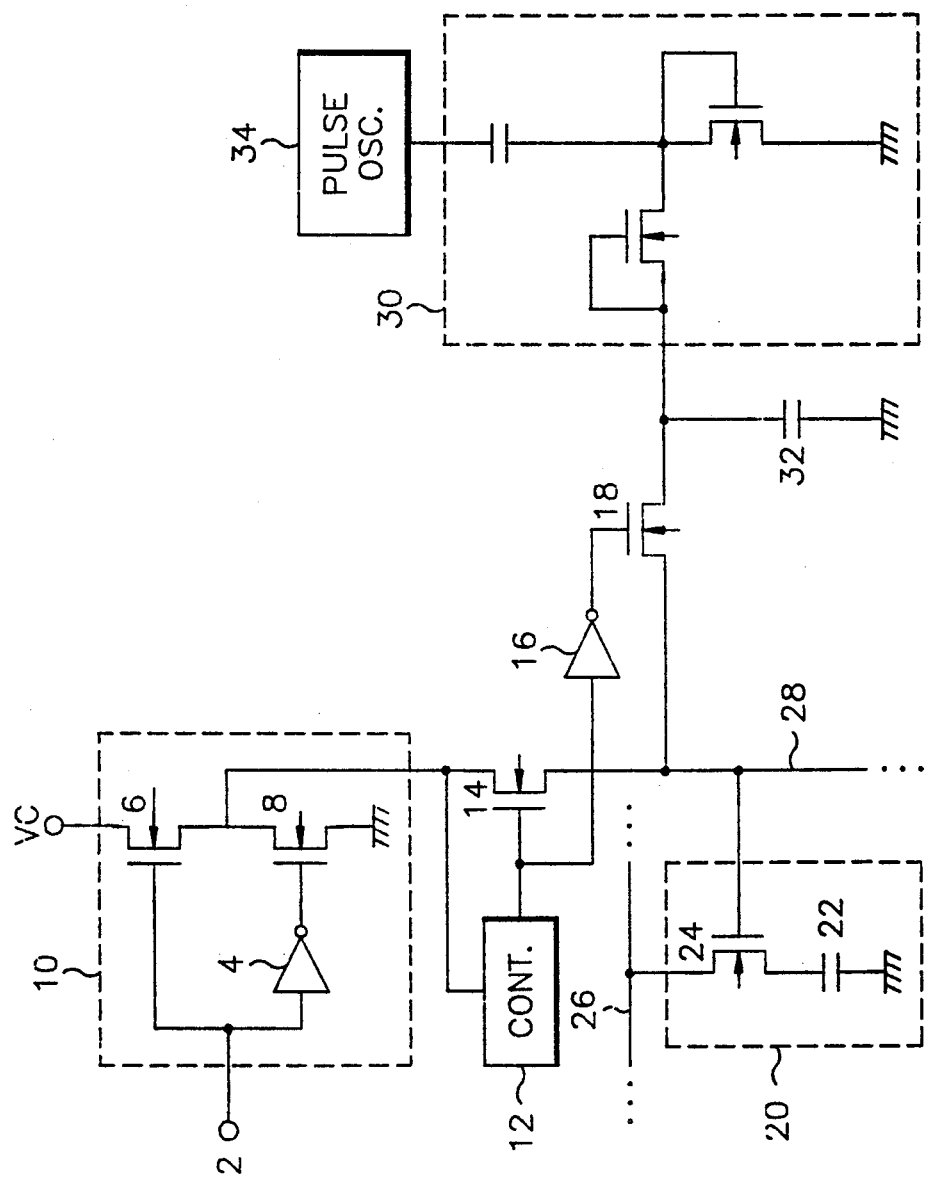
FIG. 1 is a view of a conventional word line drive circuit.
Figure 2:
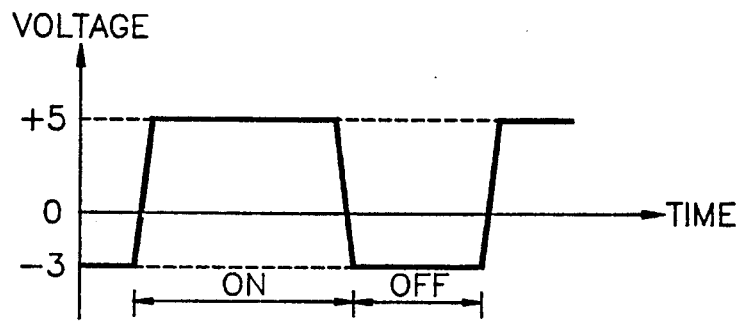
FIG. 2 is a view of a voltage timing of the word line as shown in FIG. 1.
Figure 4:
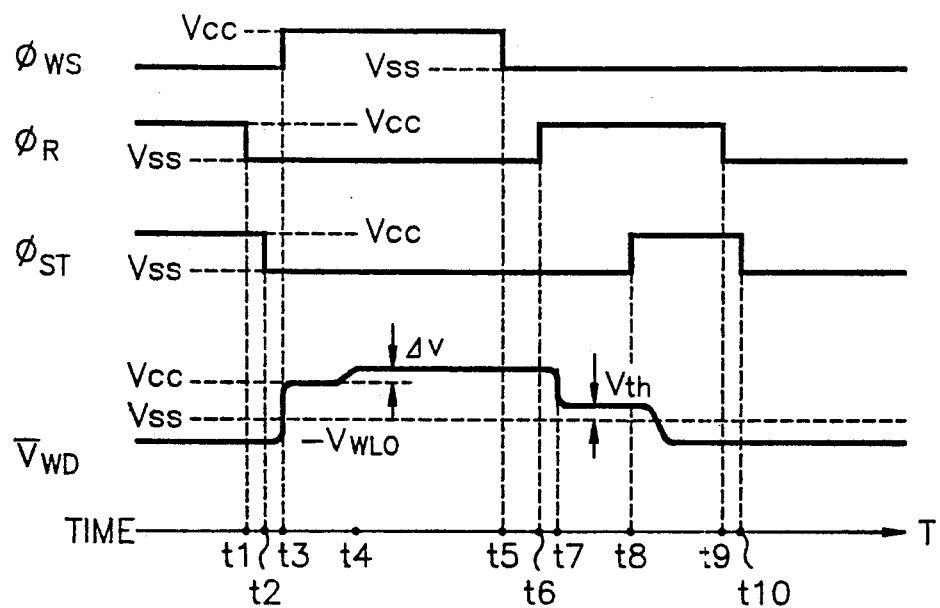
FIG. 4 is a view of voltage wave forms of signals as shown in FIG. 3.

With reference to FIG. 4, an operation of a word line drive circuit shown in FIG. 3 will be described more specifically.

Before starting the memory cycle, the word line 44 is in a discharge state of the first voltage level $-$Vwlo. After the reset clock $\phi$R is converted from "high" state to "low" state (Vss: ground) at the time t1 of starting the memory cycle, the control clock $\phi$st is converted to "low" state at the time of t2 and accordingly the second switching transistor 76 is turned off. When the word line selection signal $\phi$ws is converted from "low" state to "high" state for performing the memory cycle (read/write operation) at the time of t3, the word line 44 is charged with the boost voltage Vcc+$\Delta$V ($\Delta$V is higher than a threshold voltage) of the second voltage level of the word line boost circuit 40 by a conduction of the first switching transistor 42. Though a boost operation is begun at the time of t4 in FIG. 4, this invention is not limited to such an operation. After an active restore operation is performed right after a read operation from the storage capacitor 54 of the memory cell 50 to the bit line 46 or a write operation is performed from the bit line 46 to the storage capacitor 54 by the boosted voltage, the first switching transistor 42 is turned off at the time of t5 by the selection clock $\phi$ws (an end of memory cycle). At the time of t5 or t6, the reset clock φR is converted from "low" state to "high" state and accordingly the reset transistor 62 is turned on. Consequently the boost voltage level of the word line 44 is discharged so as to be at a threshold voltage level of the diode connection transistor 64. When the control clock φst made by the delay circuit 74 delaying the reset clock φR timely is converted from "low" state to "high" state at the time of t8, an intermediate voltage level Vth of the word line 44 is discharged to the charge pump circuit 72 by a conduction of the second switching transistor 76 and the voltage level of the word line becomes a negative first voltage level $-$Vwlo. The reset clock φR becomes low at the time of t9 and the control clock φst becomes low at the time of t10. Between the time t8 and t9, the conduction of the reset transistor 62 and the second switching transistor 76 has an effect for reducing a load of the charge pump circuit 72. In this invention, a load of the negative voltage generating circuit is reduced by discharging a word line voltage in two steps at the time of completing the memory cycle. And the timing of the reset clock φR and the control clock φst can be adjusted in order to turn on the second switching transistor 76 after turning off the reset transistor 62. A time interval of the time t7 and t8 is an extent of 5 to 10 μsec. In this short time interval, the information voltage (a logic "1" of 5 V charged voltage) of the storage capacitor 54 is effectively prevented from leaking by making an absolute value of the difference of the second voltage level (boost voltage) and the intermediate voltage being larger than that of the first voltage level $-$Vwlo and the intermediate voltage level.

Figure 5:
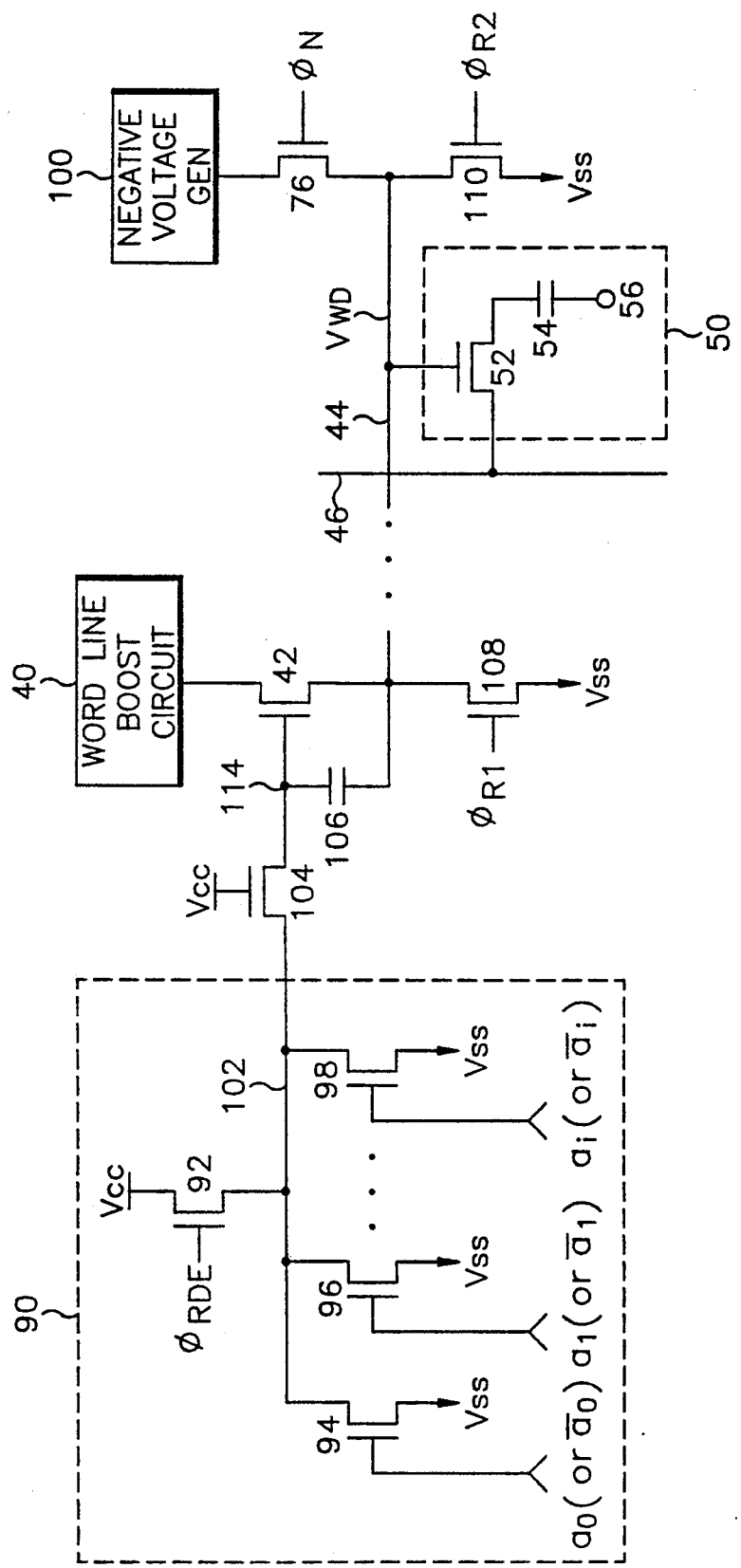
FIG. 5 is a view of another exemplary embodiment of a word line drive circuit of this invention.

FIG. 5 illustrates another exemplary embodiment of the word line drive circuit of this invention. The transistors shown in the drawing are all N channel MOS transistors and the same components as illustrated in FIG. 3 have the same reference numbers respectively.

The negative voltage generator 100 comprises the aforesaid oscillator and the charge pump circuit 72 as shown in FIG. 3, and generates the negative voltage $-$Vwlo. As a general NOR type decoder, the row decoder 90 comprises a transistor 92 connected between the source voltage Vcc and the line 102 by its drain-source path for receiving a decoder enable signal φRDE by its gate and a plurality of transistors 94–98 having drain-source paths connected parallel between the ground voltage Vss and the line 102 and gates connected to address signals. A transistor 104 is connected between the line 102 and a node 114, and transmits a voltage of the line 102 to the node 114. A gate of the transistor 104 is applied with the source voltage Vcc. Also it can be applied with a timing clock signal. The node 114 is connected to a gate of the first switching transistor 42 and an electrode of a boost capacitor 106, and the other electrode of the boost capacitor 106 and a source of the transistor 42 are connected to the word line 44. The first and second reset transistor 108, 110 are connected between the word line 44 and the,, ground voltage Vss and connects a voltage of the word line 44 to the ground voltage Vss by controlling of the first and second reset clocks φR1, φR2. The second switching transistor 76 connected between the word line 44 and the negative voltage generator 100 connects a negative voltage from the negative voltage generator 100 to the word line 44 by a control clock φN. The memory cell 50 is connected to an intersection of the bit line 46 and the word line 44.

Figure 6:
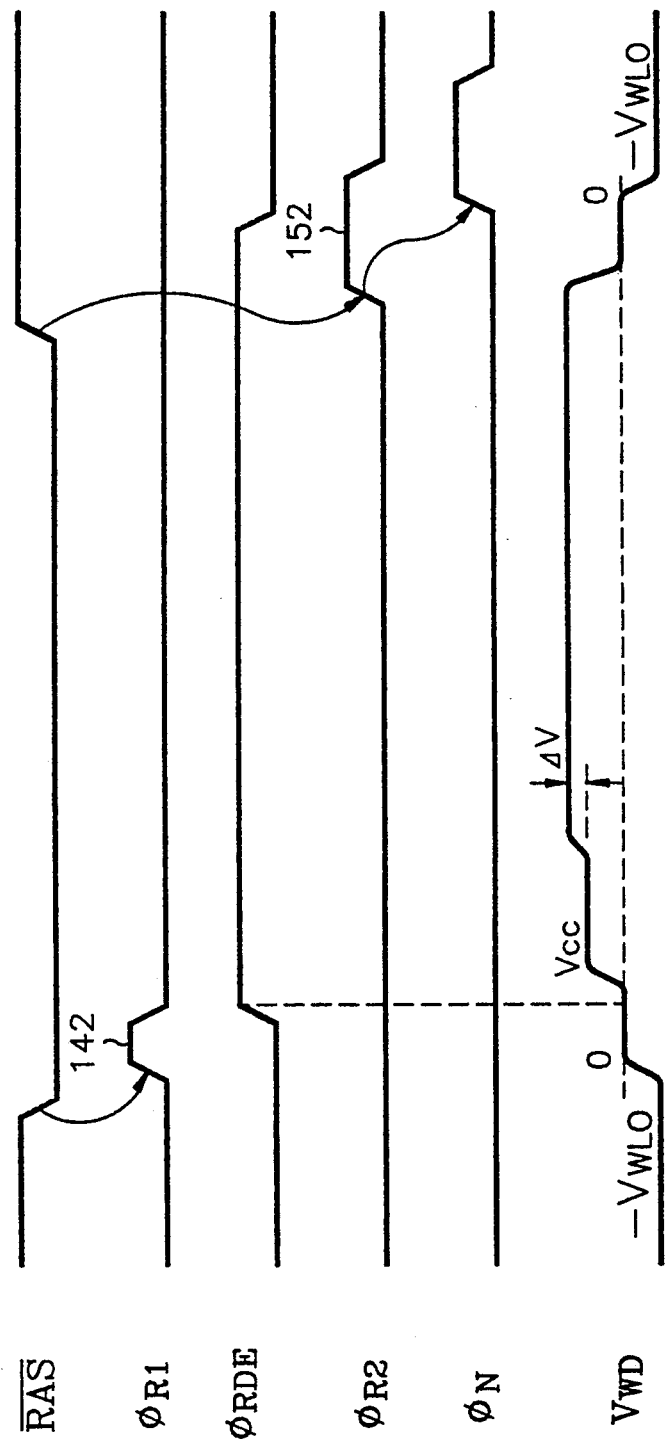
FIG. 6 is a view of voltage wave forms of signals as shown in FIG. 5.
Figure 7A:
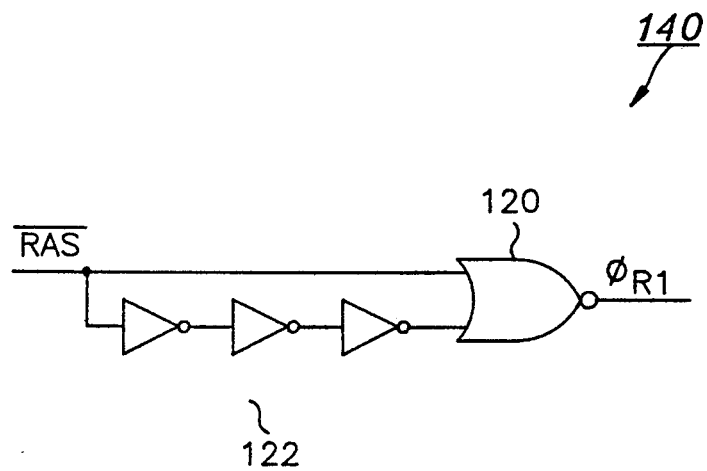
FIGS. 7A and 7B is a circuit for detecting a transition of $\overline{RAS}$ signal as shown in FIG. 6.
Figure 7B:
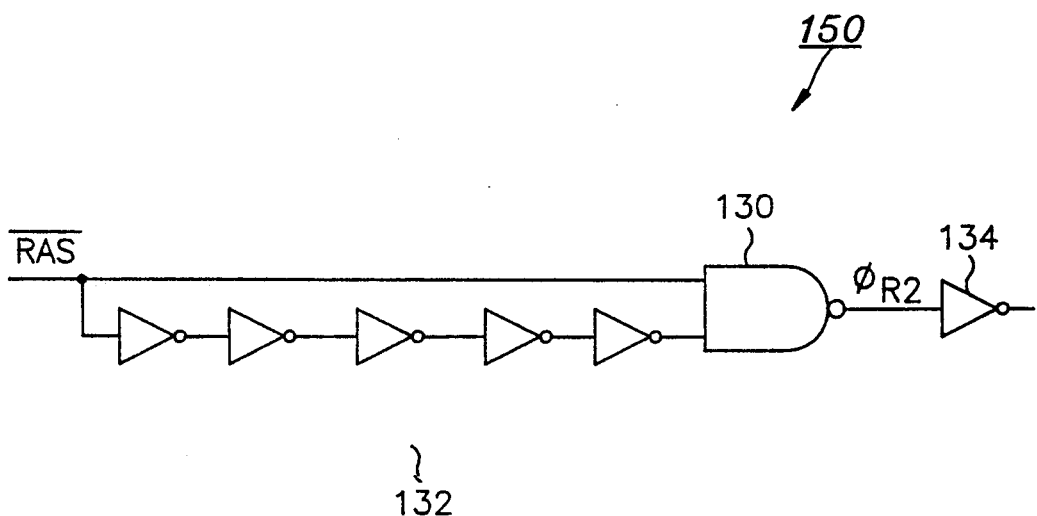

With reference to FIG. 6, a DRAM device converts an external row address strobe signal into an internal row address strobe signal $\overline{RAS}$ by a buffer circuit. In the memory cycle (read or write operation), the row address strobe signal $\overline{RAS}$ is kept in a low state. When the signal $\overline{RAS}$ is converted from a high level (Vcc) to a low level, the memory cycle is started. A transition of the signal $\overline{RAS}$ from a high level to a low level is detected by a transition detector 140 as shown in FIG. 7A and consequently the first reset clock φR1 is obtained from the transition detector 140. The transition detector 140 comprises a NOR gate 120 having two input terminals and a first delay circuit 122 comprising a plurality of inverters for inverting and delaying an input signal. One input terminal of the NOR gate 120 is connected to an input signal and the other input is connected to an output of the delay circuit 122. A width of a detection pulse 142 of the first reset clock φR1 can be adjusted by a number of inverters configuring the delay circuit 122. The row address strobe signal $\overline{RAS}$ is converted from a low level to a high level in an end of the memory cycle. The transition of the signal $\overline{RAS}$ is detected by a second transition detector 150 as shown in FIG. 7B and consequently the second reset clock φR2 is obtained. The transition detector 150 comprises a NAND gate 130 having two input terminals, a second delay circuit 132 for inverting and delaying an input signal and an inverter 134 connected to an output of the NAND gate 130. A width of a detection pulse 152 of the second reset clock φR2 can be adjusted by a number of inverters configuring the second delay circuit 132.

Before an external row address strobe signal arrives at a low level, a row address signal is supplied to an external address input terminal. When the internal row address strobe signal $\overline{RAS}$ arrives at a low level, a row address buffer (not shown in drawing) receives the row address signal from the external address input terminal. The row address buffer comprises a row address latch (not shown in drawing), and latches the received row address signal by a control signal of an internal clock generator when the row address strobe signal $\overline{RAS}$ arrives at a low level. Thereafter, the internal clock generator generates a row decoder enable signal φRDE by delaying the signal $\overline{RAS}$ timely as illustrated in FIG. 6. The row decoder 90 starts a decoding operation by the row address signal a0 (or $\overline{a0}$) $-$ ai (or $\overline{ai}$) supplied from the row address latch and the enable signal φRDE.

With reference to FIG. 5 and 6, an operation of a word line drive circuit will be described specifically.

When the row address strobe signal $\overline{RAS}$ is in a high state (non-memory cycle), a pre-charge operation is performed for operating a DRAM. The bit line 46 is charged with a given voltage (½ Vcc or Vcc for example) previously. At this time, the word line 44 is kept in a discharge state of negative voltage $-$Vwlo. When the row address strobe signal $\overline{RAS}$ arrives at a low level (a memory cycle starts), the first reset clock φR1 is produced and the first reset transistor 108 is turned on by the pulse 142. Therefore a voltage of the word line 44 is changed from the negative voltage $-$Vwlo to the ground voltage Vss. Then the row decoder 90 decodes the row address signal a0 (or $\overline{a0}$) $-$ai (or $\overline{ai}$) by the row decoder enable signal φRDE. When the row address signal designates the word line 44, all the transistor 94–98 are turned off and the line 102 is charged with a high level of Vcc. The high level of the line 102 is transmitted through the transistor 104 to the node 114 and turns on the first switching transistor 42. Accordingly the word line 44 is charged with a boosted voltage of the word line boost circuit 40 as described in the above statement with reference to FIG. 3. Because an access of the word line 44 is performed from the first voltage level of negative voltage −Vwlo to the second voltage level of boost voltage via the intermediate voltage level of ground voltage in a step-by-step operation, the transistors connected to the word line are protected and more particularly an insulated oxide film of the gate of the access transistors of the memory cells is prevented from being broken, and furthermore a false operation due to a coupling signal of an adjacent line occurred by a sudden charge of a word line is prevented.

An access operation of the memory cell 50 is described previously with reference to FIG. 3.

At the end of the memory cycle, the row address strobe signal $\overline{RAS}$ arrives at a high level, and accordingly the second reset clock $\phi R2$ is produced. The pulse 152 of the second reset clock $\phi R2$ turns on the second reset transistor 110 so as to discharge the boost voltage of the word line 44 to the ground voltage Vss. After discharging the word line 44 to an extent of the ground voltage, the second switching transistor 76 is turned on by a control clock $\phi N$ made by delaying the second reset clock $\phi R2$ timely and accordingly the word line 44 is charged with the negative voltage −Vwlo. Though the control clock $\phi N$ is a time delayed signal of the second reset clock $\phi R2$, this invention is not limited to such a method.

Though an embodiment of this invention is described in relation to an operation of the word line in the memory cycle, the present invention is not limited to such a method. For example, an automatic refresh operation is performed by a refresh control signal ($\overline{RFSH}$ for example) supplied from an external CPU or without such a signal at a high state of a $\overline{RAS}$ signal in a DRAM having an internal refresh circuit (Refer to the U.S. Pat. Nos. 4,688,196 and 4,636,989). In such a case, the internal refresh circuit generates a refresh control signal and an address signal continuously at a high state of a $\overline{RAS}$ signal. By utilizing these refresh control signal and address signal, the two step word line drive of this invention can be formed.

In the embodiment of this invention, a logic "1" voltage of the storage capacitor can be prevented from being leaked by making
an absolute value of the difference of the second,, voltage, (Boost voltage) and the intermediate voltage level (ground) being larger than that of the intermediate voltage level and the first voltage level. And it is desirable to make a holding time of the intermediate voltage level short.

As described, the load of the negative voltage generator can be reduced and the aforesaid benefits can be achieved by utilizing the two step word line drive method.

Though the embodiment of this invention is described in relation to the N channel MOS transistor, the P channel MOS transistor can also be used. In such a case, the P channel MOS transistor is turned on by the ground voltage 0V and turned off by the positive voltage +Vcc.

What is claimed is:

1. A semiconductor memory device, comprising:
    a plurality of word lines;
    a plurality of bit lines each arranged to intersect with a corresponding one of said plurality of word lines;
    a plurality of memory cells each arranged at an intersection between one of said plurality of bit lines and said corresponding one of said plurality of word lines;
    driving means connected to said plurality of word lines, for selecting and driving voltage potentials of a selected word line from a first voltage level to a second voltage level in response to an input address signal in a memory cycle;
    negative voltage generating means connected to said plurality of word lines for generating a negative voltage in a non-memory cycle; and
    means for maintaining said selected word line at an intermediate voltage level between said first voltage level and said second voltage level at least at one point between an end point and a starting point of said memory cycle, wherein an absolute value of a difference between said first voltage level and said intermediate voltage level is less than that of said second voltage level and said intermediate voltage level.

2. The semiconductor memory device as claimed in claim 1, wherein said negative voltage generating means comprises:
    charge pumping means for generating the negative voltage sufficient to discharge said selected word line from said second voltage level to said first voltage level during the non-memory cycle in dependence upon a pulse signal;
    means for generating a reset clock signal at each end of said memory cycle;
    delay means for delaying said reset clock signal for a delayed period to provide a control clock signal; and
    switch transistor means for enabling conduction of said negative voltage to said selected word line in dependence upon said control clock signal, said switch transistor means having a first electrode of a principal electrically conducting channel coupled to receive said negative voltage, a second electrode of said principal electrically conducting channel coupled to said selected word line and a gate coupled to receive said control clock signal.

3. The semiconductor memory device as claimed in claim 1, wherein said first voltage level is a negative voltage level, said second voltage level is a positive boost voltage and said intermediate voltage level is one of a ground voltage and a threshold voltage of a transistor.

4. A word line driving method in a semiconductor memory device, comprising the steps of maintaining a word line at a first voltage level in a non-memory cycle and at a second voltage level in a memory cycle; and for driving said word line at an intermediate voltage level between said first voltage level and said second voltage level at least at one point between a staring point and an end point of said memory cycle, whereby an absolute value of a difference between said first voltage level and said intermediate voltage level is less than that of said second voltage level and said intermediate voltage level.

5. A word line driving method as claimed in claim 4, characterized in that said first voltage level is a negative voltage level, said second voltage level is a positive voltage level, and said intermediate voltage level is one of a ground voltage and a threshold voltage of a transistor.

6. A semiconductor memory device, comprising:

a plurality of word lines;
a plurality of bit lines;
a plurality of memory cells, each arranged to intersect one of said plurality of word lines and a corresponding one of said plurality of bit lines;
means for charging a selected word line from a first voltage level to a source voltage level in response to an address signal upon initiation of an active cycle representative of one of a read cycle and a write cycle;
boosting means for boosting said selected word line from said source voltage level to a second voltage level during said active cycle;
negative voltage generating means for discharging said selected word line from said second voltage level to said first voltage level during an inactive cycle immediately after said active cycle but before a next active cycle; and
reset means for maintaining said selected word line at an intermediate voltage level between said first voltage level and said second voltage level at least for a period during said inactive cycle.

7. The semiconductor memory device as claimed in claim 6,w herein said first voltage level is a negative voltage level, said second voltage level is a positive boost voltage from said source voltage level and said intermediate voltage level is one of a ground voltage and a threshold voltage.

8. The semiconductor memory device as claimed in claim 7, wherein said negative voltage generating means comprises:
  charge pumping means for generating a negative voltage sufficient to discharge said selected word line from said second voltage level to said first voltage level during an inactive cycle in dependence upon a pulse signal;
  means for generating a reset clock signal at each end of said active cycle;
  delay means for delaying said reset clock signal for a delayed period to provide a control clock signal; and
  switch transistor means for enabling conduction of said negative voltage to said selected word line in dependence upon said control clock signal, said switch transistor means having a first electrode of a principal electrically conducting channel coupled to receive said negative voltage, a second electrode of said principal electrically conducting channel coupled to said selected word line and a gate coupled to receive said control clock signal.

9. The semiconductor memory device as claimed in claim 8, wherein said delay means comprises:
  first and second inverters for respectively providing first and second inverted signals in dependence upon reception of said reset clock signal;
  a ground capacitor for grounding said second inverted signal; and
  a NOR gate for logically combining said first and second inverted signals to provide said control clock signal.

10. The semiconductor memory device as claimed in claim 8, wherein said charge pumping means comprises:
  a first transistor having a first electrode of a principal electrically conducting channel connected to a ground potential, a second electrode of said principal electrically conducting channel and a gate coupled to a node for receiving said pulse clock signal via a charge capacitor; and
  a second transistor having a first electrode of a principal electrically conducting channel coupled to said node, a second electrode of said principal electrically conducting channel and a gate coupled to provide said negative voltage.

11. The semiconductor memory device as claimed in claim 10, further comprised of said first and second transistors of one of P-MOS transistors and N-MOS transistors.

12. The semiconductor memory device as claimed in claim 7, wherein said reset means comprises:
  a first transistor having a first electrode of a principal electrically conducting channel coupled to said selected word line, a second electrode of said principal electrically conducting channel coupled to a node and a gate coupled to receive said reset clock signal; and
  a second transistor having a first electrode of a principal electrically conducting channel coupled to said node, a second electrode of said principal electrically conducting channel coupled to a ground potential and a gate coupled to said node.

13. The semiconductor memory device as claimed in claim 12, further comprised of said first and second transistors of one of P-MOS transistors and N-MOS transistors.

14. A semiconductor memory device, comprising:
a plurality of word lines;
a plurality of bit lines;
a plurality of memory cells, each arranged to intersect one of said plurality of word lines and a corresponding one of said plurality of bit lines;
means for charging a selected word line from a first voltage level to a second voltage level in response to an address signal upon initiation of an active cycle representative of one of a read cycle and a write cycle;
means for charging said selected word line from said second voltage level to a third voltage level in response to a first reset clock;
boosting means for boosting said selected word line from said third voltage level to a fourth voltage level during said active cycle;
negative voltage generating means for discharging said selected word line from said fourth voltage level to said first voltage level during an inactive cycle immediately after said active cycle but before a next active cycle; and
means for maintaining said selected word line at an intermediate voltage level between said first voltage level and said fourth voltage level during a period between a second reset clock signal and a control clock signal within said inactive cycle.

15. The semiconductor memory device as claimed in claim 14, wherein said first voltage level is a negative voltage level, said second voltage level is a ground voltage level, said third voltage level is a source voltage level, said fourth voltage level is a boosted source voltage level and said intermediate voltage level is said ground voltage level.

16. The semiconductor memory device as claimed in claim 14, wherein said negative voltage generating means comprises:
  charge pumping means for generating a negative voltage sufficient to discharge said selected word line from said fourth voltage level to said first voltage level during an inactive cycle in dependence upon a pulse signal;

means for generating said second reset clock signal at each end of said active cycle;

delay means for delaying said second reset clock signal for a delayed period to provide said control clock signal;

a first transistor for enabling conduction of said negative voltage to said selected word line in dependence upon said control clock signal, said first switch transistor having a first electrode of a principal electrically conducting channel coupled to receive said negative voltage, a second electrode of said principal electrically conducting channel coupled to said selected word line and a gate coupled to receive said control clock signal; and a second transistor for enabling transmission of said second reset clock signal to said selected word line, said second switch transistor having a first electrode of a principal electrically conducting channel coupled to said selected word line, a second electrode of said principal electrically conducting channel connected to a ground potential and a gate coupled to receive said second reset clock signal.

17. The semiconductor memory device as claimed in claim 16, wherein said charge pumping means comprises:

a third transistor having a first electrode of a principal electrically conducting channel connected to said ground potential, a second electrode of said principal electrically conducting channel and a gate coupled to a node for receiving a clock signal via a charge capacitor; and a fourth transistor having a first electrode of a principal electrically conducting channel coupled to said node, a second electrode of said principal electrically conducting channel and a gate coupled to provide said negative voltage.

18. The semiconductor memory device as claimed in claim 17, wherein said first, second, third and fourth transistors are of one of P-MOS transistors and N-MOS transistors.

19. A semiconductor memory device, comprising:
a word line;
a bit line;
a memory cell electrically connected to the word lines and the bit line;
means for charging the word line from a first voltage level to a second voltage level upon initiation of an active cycle representative of one of a read cycle and a write cycle, and charging the word line from the second voltage level to a third voltage level upon activation of a decoding signal;
boosting means for boosting the word line from said third voltage level to a fourth voltage level during said active cycle; and
means for discharging the word line from said fourth voltage level to said second voltage level upon expiration of said active cycle, maintaining the word line at the second voltage level until deactivation of said decoding signal and discharging the word line from said second voltage level back to the first voltage level upon deactivation of said decoding signal.

20. The semiconductor memory device as claimed in claim 19, wherein said first voltage level is a negative voltage level of approximately −3 volts, said second voltage level is a ground voltage level, said third voltage level is a source voltage of level of approximately 5 volts, and said fourth voltage level is a boosted source voltage level comprising said source voltage level and a voltage higher than a threshold voltage of a transistor.

21. A semiconductor memory device, comprising:
a word line;
a bit line;
a memory cell electrically connected to the word lines and the bit line;
first means for charging the word line from a first voltage level to a second voltage level upon initiation of an active cycle representative of one of a read cycle and a write cycle;
boosting means for boosting the word line from said second voltage level to a boosted voltage level during said active cycle; and
second means for discharging the word line from said boosted voltage level to an intermediate voltage level after expiration of said active cycle and upon activation of a reset clock pulse, and maintaining the word line at said intermediate voltage level for a period prior to discharging the word line from said intermediate voltage level back to the first voltage level upon activation of a control clock pulse but before expiration of said reset clock pulse.

22. The semiconductor memory device as claimed in claim 21, wherein said first voltage level is a negative voltage level of approximately −3 volts, said second voltage level is a source voltage level of approximately 5 volts, and said boosted voltage level comprises said source voltage level and a voltage higher than a threshold voltage of a transistor.

23. The semiconductor memory device as claimed in claim 21, wherein an absolute value of a difference between said first voltage level and said intermediate voltage level is less than that of said second voltage level and said intermediate voltage level.

24. The semiconductor memory device as claimed in claim 21, wherein said second means comprises:

charge pumping means for generating a negative voltage sufficient to discharge the word line from said boosted voltage level to said first voltage level during an inactive cycle in dependence upon a pulse signal;

means for generating said reset clock pulse at each end of said active cycle;

delay means for delaying said reset clock pulse for a delayed period to produce said control clock pulse;

a first transistor for enabling conduction of said negative voltage to said selected word line in dependence upon said control clock pulse, said first switch transistor having a first electrode of a principal electrically conducting channel coupled to receive said negative voltage, a second electrode of said principal electrically conducting channel coupled to said selected word line and a gate coupled to receive said control clock pulse;

a second transistor for enabling transmission of said reset clock pulse to the word line, said second switch transistor having a first electrode of a principal electrically conducting channel coupled to said word line, a second electrode of said principal electrically conducting channel connected to a ground potential and a gate coupled to receive said reset clock pulse;

a third transistor having a first electrode of a principal electrically conducting channel coupled to said word line, a second electrode of said principal electrically conducting channel coupled to a node and a gate coupled to receive said reset clock pulse; and a fourth transistor having a first electrode of a principal electrically conducting channel coupled to said node, a second electrode of said principal electrically conducting channel coupled to said ground potential and a gate coupled to said node.

* * * * *

UNITED STATES PATENT AND TRADEMARK OFFICE
CERTIFICATE OF CORRECTION

PATENT NO.   :   5,297,104
DATED        :   March 22, 1994
INVENTOR(S)  :   Takashi Nakashima It is certified that error appears in the above-indentified patent and that said Letters Patent is hereby corrected as shown below:

| | | |
|---|---|---|
| Column 1, | Line 34, | After "Accordingly", Insert --,-- ; |
| | Line 47, | Preceding "U.S.", insert --a-- ; |
| Column 2, | Line 22, | After "Accordingly", Insert --,-- ; |
| | Line 27, | After "result", Insert --,-- ; |
| Column 5, | Line 59, | Preceding "ground", Delete ",,". |

Signed and Sealed this

Twentieth Day of September, 1994

Attest:

BRUCE LEHMAN

*Attesting Officer*       *Commissioner of Patents and Trademarks*